(12) United States Patent
Davis et al.

(10) Patent No.: US 6,486,557 B1
(45) Date of Patent: Nov. 26, 2002

(54) HYBRID DIELECTRIC STRUCTURE FOR IMPROVING THE STIFFNESS OF BACK END OF THE LINE STRUCTURES

(75) Inventors: Charles R. Davis, Fishkill, NY (US); Daniel Charles Edelstein, New Rochelle, NY (US); John C. Hay, Knoxville, TN (US); Jeffrey C. Hedrick, Montvale, NJ (US); Christopher Jahnes, Upper Saddle River, NJ (US); Vincent McGahay, Poughkeepsie, NY (US); Henry A. Nye, III, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/515,110

(22) Filed: Feb. 29, 2000

(51) Int. Cl.[7] .................................................. H01L 23/48
(52) U.S. Cl. .......................... 257/758; 257/759; 257/774
(58) Field of Search ................................ 257/758, 759, 257/774; 526/281, 283

(56) References Cited

U.S. PATENT DOCUMENTS

| | | | |
|---|---|---|---|
| 4,789,648 A | 12/1988 | Chow et al. | |
| 5,486,493 A | 1/1996 | Jeng | |
| 5,591,677 A | * 1/1997 | Jeng | 437/195 |
| 5,616,959 A | 4/1997 | Jeng | |
| 5,691,573 A | 11/1997 | Avanzino et al. | |
| 5,744,865 A | * 4/1998 | Jeng et al. | 257/750 |
| 5,776,834 A | 7/1998 | Avanzino et al. | |
| 5,821,621 A | 10/1998 | Jeng | |
| 5,942,328 A | * 8/1999 | Grill et al. | 428/408 |
| 5,965,679 A | * 10/1999 | Godschalx | 526/281 |
| 6,093,636 A | * 7/2000 | Carter et al. | 438/623 |
| 6,107,357 A | * 8/2000 | Hawker et al. | 521/77 |
| 6,140,226 A | * 10/2000 | Grill et al. | 438/637 |
| 6,147,009 A | * 11/2000 | Grill et al. | 438/780 |

* cited by examiner

Primary Examiner—Kamand Cuneo
Assistant Examiner—Lourdes Cruz
(74) Attorney, Agent, or Firm—Jay H. Anderson; James J. Cioffi; Wood, Phillips, VanSanten, Clark & Mortimer

(57) ABSTRACT

A multi-level, coplanar copper damascene interconnect structure on an integrated circuit chip includes a first planar interconnect layer on an integrated circuit substrate and having plural line conductors separated by a dielectric material having a relatively low dielectric constant and a relatively low elastic modulus. A second planar interconnect layer on the first planar interconnect layer comprises a dielectric film having an elastic modulus higher than in the first planar interconnect layer and conductive vias therethrough. The vias are selectively in contact with the line conductors. A third planar interconnect layer on the second planar interconnect layer has plural line conductors separated by the dielectric material and selectively in contact with the vias.

11 Claims, 1 Drawing Sheet

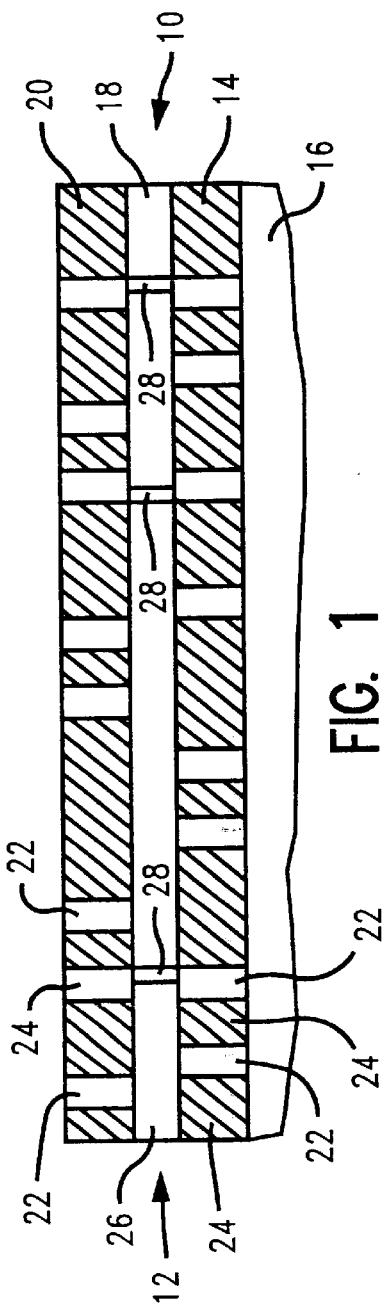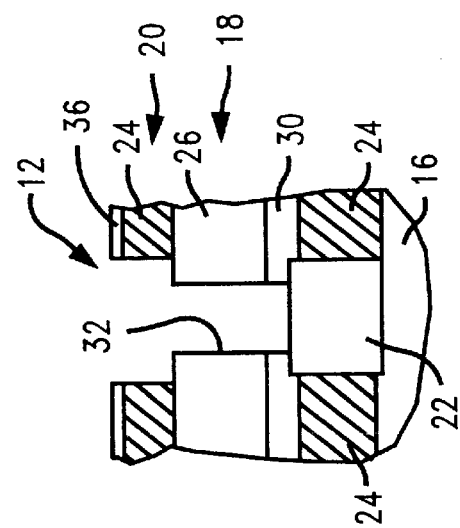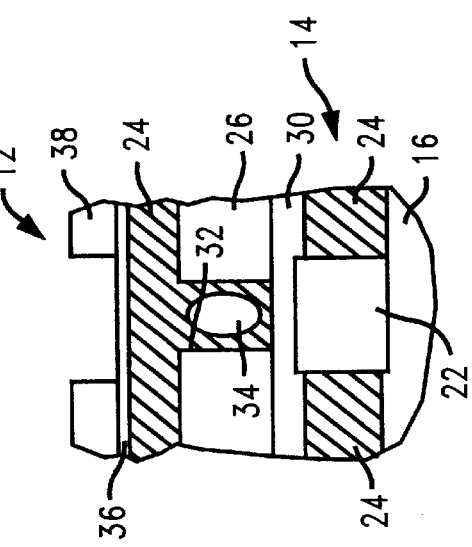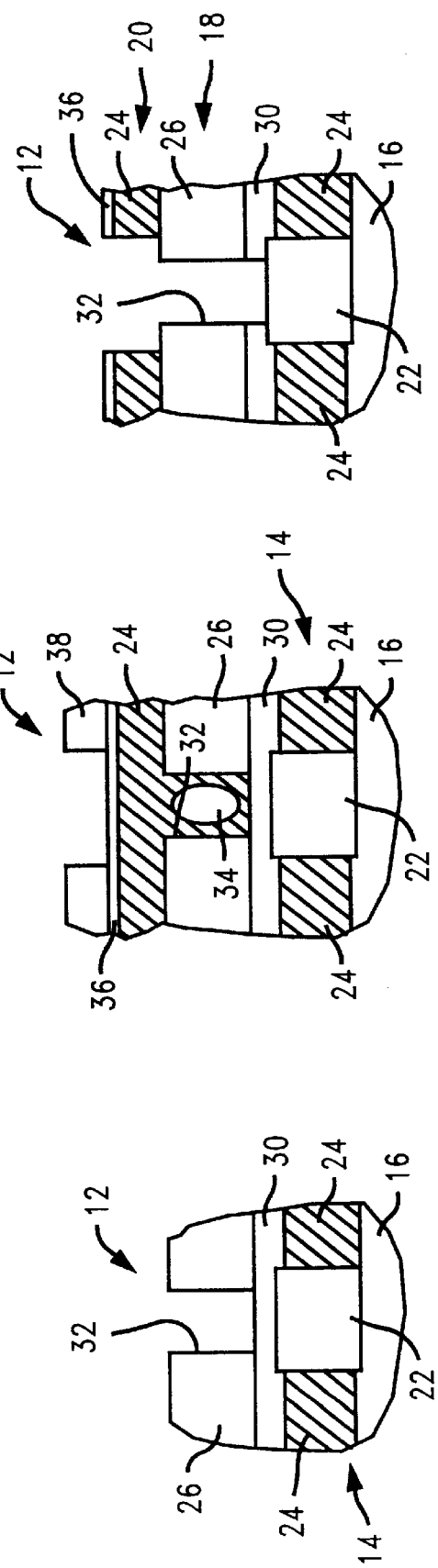

HYBRID DIELECTRIC STRUCTURE FOR IMPROVING THE STIFFNESS OF BACK END OF THE LINE STRUCTURES

FIELD OF THE INVENTION

This invention relates to a multi-level, coplanar interconnect structure on an integrated circuit and, more particularly, to a hybrid dielectric structure for improving stiffness of back end of the line structures.

BACKGROUND OF THE INVENTION

Continued improvement in integrated circuit density is due, in part, to advances in interconnection technology. IC manufacturing generally includes front end of the line (FEOL) and back end of the line (BEOL) processes. The FEOL processes relate to formation of transistors and capacitors and the like along with polysilicon gate layers. BEOL processes include steps to form metal interconnects and associated dielectrics. Conventional interconnect structures used aluminum for conductors. The aluminum was deposited as a film and then patterned to form interconnects. The dielectric insulation material was then added and planarized.

More recently, processes using copper interconnects have been developed. One such process uses damascene copper electroplating for chip interconnections. This process initially forms a planar insulation layer. The insulation layer is etched to form trenches or vias which are then filled with metal and polished to planarize. In a dual damascene process two patterns are combined into one.

The transition from aluminum to copper interconnects has resulted in reduction in resistance of interconnects. To reduce RC noise, dielectric materials having low dielectric constants ( also referred to as "low k") are now being integrated into BEOL structures. However, low k dielectric materials are not generally structural in nature. They can not support applied loads encountered during wire bonding or ball bonding without adversely affecting the electrical reliability of the device. However, these changes must be addressed as the industry changes from quartz which has a high elastic modulus to low modulus materials used as dielectrics.

The present invention is directed to overcoming one or more of the problems discussed above, in a novel and simple manner.

SUMMARY OF THE INVENTION

In accordance with the invention, a hybrid dielectric interconnect structure using low k dielectric materials utilizes low modulus dielectric materials at the line level where noise is most likely, and higher elastic modulus dielectric materials which are structural in nature at the via levels.

Broadly, there is disclosed herein a multi-level, coplanar interconnect structure on an integrated circuit chip including a planar line layer having plural interconnect conductors separated by a dielectric material having a relatively low dielectric constant and a relatively low elastic modulus. A planar via layer comprises a dielectric film having an elastic modulus higher than in the line layer and conductive vias therethrough. One of the line and via layer is on an integrated circuit substrate and defines a first layer and the other of the line and via layer is on the first layer so that the vias are selectively in contact with the line layer conductors.

It is a feature of the invention that the dielectric film has a relatively low dielectric constant.

It is another feature of the invention that the dielectric material has a dielectric constant less than about 3.0.

It is another feature of the invention that the dielectric material comprises a polyarylene ether material.

It is still another feature of the invention that the dielectric material comprises an organic or an inorganic material. The dielectric film comprises an inorganic thin film.

It is yet another feature of the invention that the dielectric film comprises SiCOH film.

There is disclosed in accordance with another aspect of the invention, a multi-level, coplanar copper damascene interconnect structure on an integrated circuit chip including a first planar interconnect layer on an integrated circuit substrate and having plural line conductors separated by a dielectric material having a relatively low dielectric constant and a relatively low elastic modulus. A second planar interconnect layer on the first planar interconnect layer comprises a dielectric film having an elastic modulus higher than in the first planar interconnect layer and conductive vias therethrough. The vias are selectively in contact with the line conductors. A third planar interconnect layer on the second planar interconnect layer has plural line conductors separated by the dielectric material and selectively in contact with the vias.

There is disclosed in accordance with a further aspect of the invention a multi-level, coplanar interconnect structure on an integrated circuit chip including a planar line layer having plural interconnect conductors separated by an organic or inorganic dielectric material having a relatively low dielectric constant. A planar via layer comprises an inorganic dielectric film having a relatively low dielectric constant and conductive vias therethrough. One of the line and via layer is on an integrated circuit substrate and defines a first layer and the other of the line and via layer is on the first layer so that the vias are selectively in contact with the line layer conductors.

Further features and advantages of the invention will be readily apparent from the specification and from the drawings.

BRIEF DESCRIPTION OF THE DRAWINGS

FIG. 1 is a sectional view illustrating a multi-level, coplanar interconnect structure in accordance with the invention used on an integrated circuit chip; and FIGS. 2–4 illustrate the process for fabricating the interconnect structure of FIG. 1.

DETAILED DESCRIPTION OF THE INVENTION

As aspect ratios for copper interconnects are increased with next-generation devices, crosstalk between lines is most likely between lines on the same line level, and less likely to occur between lines existing on different line levels, i.e., capacitance across a via level. In accordance with the invention, dielectric materials having low k dielectric constants separate lines on a given line level. At the via levels, where copper density is insignificant, stiffness is increased by using higher modulus dielectric materials at the via levels.

Referring initially to FIG. 1, an integrated circuit chip 10 is illustrated having a multi-level, coplanar interconnect structure 12 in accordance with the invention. The interconnect structure includes a first planar layer 14 on a substrate 16. A second planar layer 18 is on the first planar layer 14. Finally, a third planar layer 20 is on the second planar layer 18.

The substrate 16 comprises a silicon integrated circuit with underlying electronic devices. The first planar layer 14 comprises a line layer. The second planar layer 18 comprises a via layer. The third planar layer 20 comprises a line layer.

The line layers 14 and 20 have plural interconnect conductors 22 separated by a dielectric material 24. The via layer 18 comprises a dielectric film 26 having plural conductive vias 28 therethrough. The vias 28 are in selective contact with certain ones of the conductors 22. As is apparent, the particular connections are determined as required by the design of the integrated circuit chip 10.

In accordance with the invention, the dielectric material 24 in the line layers 14 and 20 comprises a low k and low elastic modulus dielectric. The dielectric film 26 in the via layer 18 has a moderately low k dielectric constant and a higher elastic modulus. A conventional dielectric material used in integrated circuits is silicon dioxide which has a dielectric constant k=4.0 and an elastic modulus of about 75 GPa. In the illustrated embodiment of the invention, the dielectric constant at the line levels 14 and 20 are lower than 4.0 and advantageously lower than 3.0 and an elastic modulus is less than 20 GPa. In the illustrated embodiment of the invention, the dielectric material 24 may comprise a SiLK semiconductor dielectric resin from the Dow Chemical Company (SILK is a registered trademark of Dow Chemical Company). SiLK is a polyarylene ether spun on organic material cured to form an insulating film. Alternatively, the dielectric material 24 may be an inorganic material. SiLK has a dielectric constant of k=2.65. The dielectric film 26 may comprise, for example, an inorganic thin film such as SiCOH which has a dielectric constant of k=2.7. In accordance with the invention, a higher dielectric constant material could be used for the film 26 in the via layer 18, including $SiO_2$. However, the higher k material is not used in the line layers 14 or 20.

Referring to FIGS. 2–4, the process of forming the interconnect structure 12 is illustrated. FIG. 2 illustrates the substrate 16 including the first layer 14, comprising the line layer, thereon. The layer 14 includes one of the copper interconnect conductors 22 and the dielectric material 24. In the illustrated embodiment of the invention, as discussed above, the dielectric material 24 comprises SiLK which is spun on and cured to form an insulating film. The interconnect line conductor 22 is then formed using conventional copper damascene processing. A barrier layer 30 overlies the first layer 14. The inorganic dielectric thin film 26 is then deposited on the first layer 14 using plasma-enhanced chemical vapor deposition (PECVD) of SiCOH. A via opening 32 is then formed using conventional patterning and etching techniques.

Referring to FIG. 3, the SiLK dielectric material 24 is spun on and cured. As illustrated, a void 34 may be formed in the via opening 32. A hard mask cap layer 36 is formed on top of the SiLK 24 and then a photo-resist layer 38 is patterned according to the conductor line pattern to be formed. Referring to FIG. 4, a SiLK etch is performed to remove the SiLK dielectric material 24 in the non-patterned area. A different gas is used to remove the barrier layer 30 underlying the via opening 32. The dual-damascene process can then be used to electroplate the conductive vias 28 at the via level 18 and the line conductors 22 in the third planar layer 20.

As is apparent, the interconnect structure 12 could use additional line layers and/or via layers. Likewise, the first layer could be a via layer and the second layer a line layer, etc., according to chip requirements.

Thus, the present invention is particularly directed toward use of dual low-dielectric constant materials with copper damascene interconnects. Each dielectric is used in a planar film, deposited on a planar surface. Each gap between the interconnects on a planar level, regardless of spacing, is filled with the same low k material. All interfaces between different dielectrics are purely horizontal. A higher k material may be used at the via level, but not between the interconnect conductors, in accordance with the invention.

We claim:

1. A multi-level, coplanar interconnect structure on an integrated circuit chip, comprising:

a planar line layer having plural interconnect conductors, all separated by a dielectric material having a relatively low dielectric constant and a relatively low elastic modulus; and a planar via layer comprising a dielectric film having an elastic modulus higher than in the line layer and conductive vias therethrough, wherein one of the line and via layer is on an integrated circuit substrate and defines a first layer having an upper horizontal planar surface and another of the line and via layer has a lower horizontal planar surface on the first layer upper horizontal planar surface so that the vias are selectively in contact with the line layer conductors and all interfaces between the dielectric material and the dielectric film are horizontal.

2. The multi-level, coplanar interconnect structure of claim 1 wherein the dielectric film has a relatively low dielectric constant.

3. The multi-level, coplanar interconnect structure of claim 1 wherein the dielectric material has a dielectric constant less than about 3.0.

4. The multi-level, coplanar interconnect structure of claim 1 wherein the dielectric material comprises a polyarylene ether material.

5. The multi-level, coplanar interconnect structure of claim 1 wherein the dielectric material comprises an organic material.

6. The multi-level, coplanar interconnect structure of claim 1 wherein the dielectric film comprises an inorganic thin film.

7. The multi-level, coplanar interconnect structure of claim 1 wherein the dielectric comprises SiCOH film.

8. A multi-level, coplanar interconnect structure on an integrated circuit chip, comprising:

a planar line layer having plural interconnect conductors all separated by a dielectric material having a relatively low dielectric constant; and a planar via layer comprising an inorganic dielectric film having a relatively low dielectric constant and conductive vias therethrough, wherein one of the line and via layer is on an integrated circuit substrate and defines a first layer having an upper horizontal planar surface and another of the line and via layer has a lower horizontal planar surface on the first layer upper horizontal planar surface so that the vias are selectively in contact with the line layer conductors and all interfaces between the dielectric material and the dielectric film are horizontal.

9. The multi-level, coplanar interconnect structure of claim 8 wherein the dielectric material has a lower elastic modulus than the dielectric film.

10. The multi-level, coplanar interconnect structure of claim 8 wherein the dielectric material and the dielectric film each have a dielectric constant less than about 3.0.

11. The multi-level, coplanar interconnect structure of claim 9 wherein the dielectric material has an elastic module less than 20 GPa.

\* \* \* \* \*